US006023028A

United States Patent [19]

Neuhalfen

[11] Patent Number: 6,023,028

[45] Date of Patent: *Feb. 8, 2000

[54] SURFACE-MOUNTABLE DEVICE HAVING A VOLTAGE VARIABLE POLGMERIC MATERIAL FOR PROTECTION AGAINST ELECTROSTATIC DAMAGE TO ELECTRONIC COMPONENTS

[75] Inventor: Andrew J. Neuhalfen, Algonquin, Ill.

[73] Assignee: Littelfuse, Inc., Des Plaines, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/474,940

[22] Filed: Jun. 7, 1995

Related U.S. Application Data

[63] Continuation-in-part of application No. 08/247,584, May 27, 1994, Pat. No. 5,552,757.

[51] Int. Cl.[7] ........................ H05K 1/00

[52] U.S. Cl. ........................ 174/250; 361/303

[58] Field of Search ........................ 174/250, 255, 174/52.4; 361/303, 306.1, 310, 311

[56] References Cited

U.S. PATENT DOCUMENTS

| | | | |
|---|---|---|---|
| 3,619,725 | 11/1971 | Soden et al. | 317/101 A |
| 3,913,219 | 10/1975 | Lichtblau | 29/592.1 |
| 4,198,744 | 4/1980 | Nicolay | 29/623 |
| 4,278,706 | 7/1981 | Barry | 427/96 |
| 4,503,415 | 3/1985 | Rooney et al. | 337/160 |
| 4,514,718 | 4/1985 | Birx | 337/407 |
| 4,533,896 | 8/1985 | Belopolsky | 337/232 |
| 4,540,969 | 9/1985 | Sugar | 337/232 |
| 4,547,830 | 10/1985 | Yamauchi | 361/104 |
| 4,554,732 | 11/1985 | Sadlo et al. | 29/620 |

(List continued on next page.)

FOREIGN PATENT DOCUMENTS

| | | |
|---|---|---|
| 1 477 572 | 1/1975 | European Pat. Off. . |
| 270954 | 6/1988 | European Pat. Off. . |
| 0 301 533 A2 | 7/1988 | European Pat. Off. . |
| 0 453 217 A1 | 4/1991 | European Pat. Off. . |
| 0 581 428 A1 | 6/1993 | European Pat. Off. . |
| 0043701 | 2/1990 | Japan . |
| 04242036 | 1/1991 | Japan . |
| 4-033230 | 2/1992 | Japan . |
| 4033230 | 2/1992 | Japan . |
| 4-245129 | 9/1992 | Japan . |
| 4-245132 | 9/1992 | Japan . |
| 4-248221 | 9/1992 | Japan . |
| 4-255627 | 9/1992 | Japan . |
| 4245129 | 9/1992 | Japan . |
| 4245132 | 9/1992 | Japan . |

(List continued on next page.)

OTHER PUBLICATIONS

Deposition Technologies for Films and Coatings; Developments and Applications; pp. 412–415, Oct. 1983 Bunshah et al.

*Primary Examiner*—Kristine Kincaid
*Assistant Examiner*—Hung V Ngo
*Attorney, Agent, or Firm*—Wallenstein & Wagner, Ltd.

[57] ABSTRACT

The thin film, circuit device is an subminiature overvoltage protection device in a surface mountable configuration for use in printed circuit board or thick film hybrid circuit technology. The surface mountable device (SMD) is designed to protect against electrostatic discharge (ESD) damage to electronic components.

The circuit protection device includes three material subassemblies. The first subassembly generally includes a substrate carier, electrodes, and terminal pads for connecting the protection device 60 to a PC board. The second subassembly includes a voltage variable polymer material with non-linear characteristics, and the third subassembly includes a cover coat for protecting other elements of the circuit protection device.

7 Claims, 6 Drawing Sheets

U.S. PATENT DOCUMENTS

| | | | |
|---|---|---|---|
| 4,612,529 | 9/1986 | Gurevich et al. | 337/255 |
| 4,626,818 | 12/1986 | Hilger | 337/166 |
| 4,652,848 | 3/1987 | Hundrieser | 337/297 |
| 4,720,402 | 1/1988 | Wojcik | 427/282 |
| 4,726,991 | 2/1988 | Hyatt et al. | 428/329 |
| 4,771,260 | 9/1988 | Gurevich | 337/231 |
| 4,792,781 | 12/1988 | Takahashi et al. | 338/307 |
| 4,837,520 | 6/1989 | Golke | 324/550 |
| 4,873,506 | 10/1989 | Gurevich | 337/290 |
| 4,958,426 | 9/1990 | Endo et al. | 29/623 |
| 4,975,551 | 12/1990 | Syvertson | 200/144 |
| 4,977,357 | 12/1990 | Shrier | 338/21 |
| 5,058,250 | 10/1991 | Turnbull | 29/25.35 |
| 5,084,691 | 1/1992 | Lester et al. | 337/297 |
| 5,095,297 | 3/1992 | Perreault et al. | 337/297 |
| 5,097,246 | 3/1992 | Cooke et al. | 337/297 |
| 5,097,247 | 3/1992 | Doerrwaechter | 337/405 |
| 5,102,506 | 4/1992 | Tanielian et al. | 205/118 |
| 5,102,712 | 4/1992 | Peirce et al. | 428/76 |
| 5,115,220 | 5/1992 | Suuronen et al. | 337/297 |
| 5,140,295 | 8/1992 | Vermot-gaud et al. | 337/297 |
| 5,148,141 | 9/1992 | Suuronen | 337/297 |
| 5,155,462 | 10/1992 | Morrill, Jr. | 337/3 |
| 5,166,656 | 11/1992 | Badihi et al. | 337/297 |
| 5,232,758 | 8/1993 | Juskey et al. | 428/76 |
| 5,262,754 | 11/1993 | Collins | 338/21 |
| 5,340,775 | 8/1994 | Carruthers et al. | 437/246 |
| 5,363,082 | 11/1994 | Gurevich | 337/227 |
| 5,374,590 | 12/1994 | Batdorf et al. | 437/173 |
| 5,438,166 | 8/1995 | Carey et al. | 174/261 |
| 5,537,108 | 7/1996 | Nathan et al. | 340/825.84 |
| 5,552,757 | 9/1996 | Blecha et al. | 337/297 |
| 5,592,016 | 1/1997 | Go et al. | 257/530 |

FOREIGN PATENT DOCUMENTS

| | | |
|---|---|---|
| 4248221 | 9/1992 | Japan . |
| 4255627 | 9/1992 | Japan . |
| 5-166454 | 7/1993 | Japan . |
| 5166454 | 7/1993 | Japan . |
| 05314888 | 11/1993 | Japan . |
| 06103880 | 4/1994 | Japan . |
| 1803554 | 3/1969 | Netherlands . |
| 3728489 A1 | 8/1987 | Netherlands . |
| WO 83/01153 | 3/1983 | WIPO . |
| WO 90/00305 | 1/1990 | WIPO . |

SURFACE-MOUNTABLE DEVICE HAVING A VOLTAGE VARIABLE POLGMERIC MATERIAL FOR PROTECTION AGAINST ELECTROSTATIC DAMAGE TO ELECTRONIC COMPONENTS

RELATED APPLICATION

The present patent is a continuation-in-part of U.S. patent application Ser. No. 08/247,584, filed on May 27, 1994, and which issued on Sep. 3, 1996, as U.S. Pat. No. 5,552,757.

DESCRIPTION

1. Technical Field

The present invention relates generally to surface-mountable devices (SMDs) for the protection of electrical circuits. More particularly, this invention relates to surface-mountable devices for protection against electrostatic discharge within electrical circuits.

2. Background Prior Art

Printed circuit (PC) boards have found increasing application in electrical and electronic equipment of all kinds. The electrical circuits formed on these PC boards, like larger scale, conventional electrical circuits, need protection against electrical overvoltage. This protection is typically provided by commonly known electrostatic discharge devices that are physically secured to the PC board.

Examples of such a devices include silicon diodes and metal oxide varistor (MOV) devices. However, there are several problems with these devices. First, there are numerous aging problems associated with these types of devices, as is well known. Second, these types of devices can experience catastopic failures, also as is well known. Third, these types of devices may burn or fail during a short mode situation. Numerous other disadvantages come to mind when using these devices during the manufacture of a PC board.

It has been found in the past that certain types of materials can provide protection against fast transient overvoltage pulses within electronic circuitry. These materials at least include those types of materials found in U.S. Pat. Nos. 4,097,834, 4,726,991, 4,977,357, and 5,262,754. However, the time and costs associated with incorporating and effectively using these materials in microelectronic circuitry is and has been significant. The present invention is provided to alleviate and solve these and other problems.

SUMMARY OF THE INVENTION

The present invention is a thin film, electrostatic discharge surface mounted device (ESD/SMD) which comprises three material subassemblies. The first subassembly includes the substrate carrier.

The first or substrate-carrier subassembly comprises a carrier base having two electrodes on the top surface which are separated by a gap of controlled width, and wrap-around terminal pads on the side and bottom of the carrier base. The second subassembly or voltage variable polymeric material is applied between the two electrodes and effectively bridges gap between the electrodes. The third subassembly or cover coat is placed over the polymeric material and electrodes on the top surface of the first or substrate subassembly. The third subassembly provides a protective layer which overlies the second subassembly and electrodes, as well as part of the terminal pads connected to the electrodes, so as to provide protection from impacts, oxidation, and other effects, as will be described further below.

The third subassembly or protective layer is preferably made of a polymeric material, such as polyurethane or polycarbonate. In addition, the most preferred supporting substrate is an FR-4 epoxy or a polyimide.

Another aspect of the invention is a thin film, surface-mounted configuration of the ESD/SMD. In particular, the device comprises electrodes made of a conductive metal. The first conductive metal is preferably, but not exclusively, selected from the group including copper, silver, nickel, titanium, aluminum or alloys of these conductive metals. One preferred metal for the electrodes of the ESD/SMD invention is copper.

The first conductive metal or electrodes may be deposited onto the first first subassembly in many shapes. Photolithographic, mechanical and laser processing techniques may be employed to create very small, intricate and complex electrode geometries, as well as creating an appropriate gap width. This capability, when combined with the extremely thin film coatings applied through electrochemical and physical vapor deposition (PVD) techniques, enables these subminiature protective devices 60 to control the gap between the electrodes and protect circuits from significant levels of overvoltage.

The location of the electrodes at the top of the substrate of the ESD/SMD enables one to use laser processing methods as a high precision secondary operation, in that way trimming the gap width, and thus, the rating of the device.

Other features and advantages of the invention will be apparent from the following specification taken in conjunction with the following drawings.

DETAILED DESCRIPTION

Figure 1:
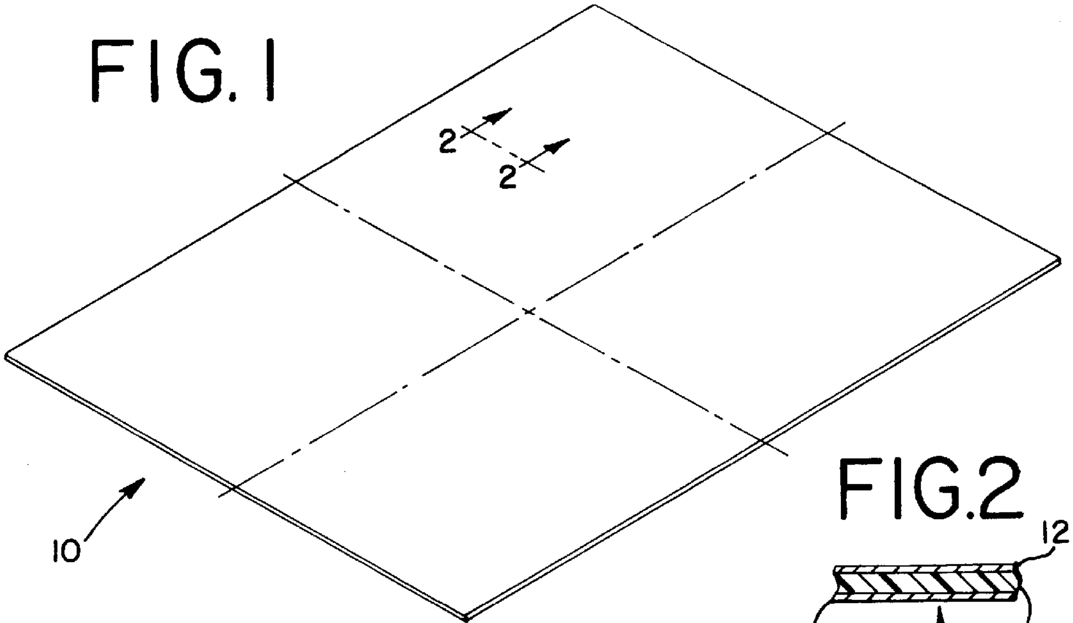
FIG. 1 is a perspective view of a copper-plated, FR-4 epoxy sheet used to make a subminiature ESD/SMDs in accordance with the present invention.

While this invention is susceptible of embodiments in many different forms, there is shown in the drawings and will herein be described in detail, a preferred embodiment of the invention with the understanding that the present disclosure is to be considered as an exemplification of the principles of the invention and is not intended to limit the broad aspects of the invention to the embodiment illustrated.

Figure 13:
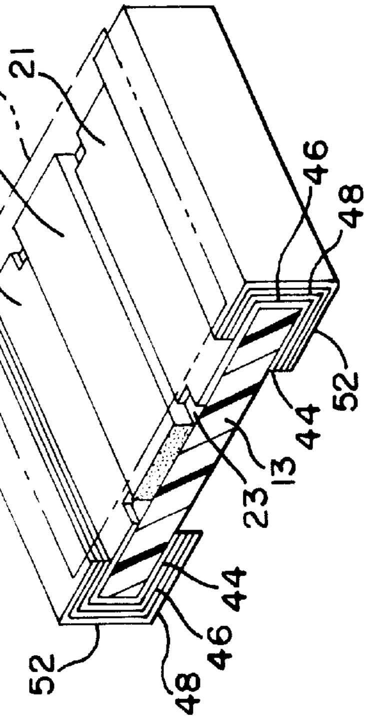
FIG. 13 shows the individual ESD/SMD in accordance with the invention as it is finally made, and after a so-called dicing operation in which a diamond saw is used to cut the strips along parallel planes to form the individual devices.

One preferred embodiment of the present invention is shown in FIG. 13. The thin film, circuit device is an subminiature overvoltage protection device in a surface mountable configuration for use in printed circuit board or thick film hybrid circuit technology. One given name for the device is an electrostatic discharge surface-mounted device (ESD/SMD). The surface mountable device (SMD) is designed to protect against electrostatic discharge (ESD) damage to electronic components. The layout and design of the ESD/SMD device is such that it can be manufactured in many sizes. One standard industry size for surface mount devices, generally, is 125 mils. long by 60 mils. wide. This sizing is applicable to the present invention, and can be designated, for shorthand purposes, as "1206" sized devices. It will be understood, however, that the present invention can be used on all other standard sizes for surface mountable devices, such as 1210, 0805, 0603 and 0402 devices, as well as non-standard sizes. The protection device of the present invention are designed to replace silicon diodes and MOV technologies which are commonly used for low power protection applications.

The protection device generally comprises three material subassemblies. As will be seen, the first subassembly generally includes a substrate carier or substrate 13, electrodes 21, and terminal pads 34, 36 for connecting the protection device 60 to the PC board. The second subassembly includes the voltage variable polymer material 43, and the third subassembly includes the cover coat 56.

The first or substrate carrier subassenmbly comprises a carrier base 13 having two electrodes 21 on the top surface which are separated by a gap 25 of controlled width W2, and wrap-around terminal pads 34, 36 on the top 57, bottom 58, and side 59 of the first subassembly 13. The second subassembly or voltage variable polymeric material 43 is applied between these two electrodes 21 and effectively bridges the gap 25. A cover coat 56 is placed over the polymeric material 43 and the electrodes 21 on the top surface 57 of the substrate subassembly, and partially on the top 57 of the terminal pads 34, 36. The third subassembly provides protection from impacts which may occur during automated assembly, and protection from oxidation and other effects during use.

More particularly, the first or substrate subassembly incorporates a carrier base 13 made of a semi-rigid epoxy material. This material exhibits physical properties nearly identical with the standard substrate material used in the printed circuit board industry, thus providing for extremely well matched thermal and mechanical properties between the device and the board. Other types of material can be used as well.

The first subassembly further includes two metal electrodes 21 which are a part of the pads 34, 36 as one continuous layer or film. As will be seen, the pads 34, 36 are made up of several layers, including a base copper layer 44 which also makes up the electrodes 21, a supplemental copper layer 46, a nickel layer 48, and a tin-lead layer 50 to make up the rest of the pads 34, 36. In another embodiment, the supplemental copper layer 46 also makes up a second copper layer of the electrodes 21 (not shown), thereby increasing the thickness of the electrodes 21. The base copper layer of the pads and the electrodes are simultaneously deposited by (1) electrochemical processes, such as the plating described in the preferred embodiment below; or (2) by physical vapor deposition (PVD). Such simultaneous deposition ensures a good conductive path between the pads 34, 36, electrodes 21, and second subassembly 43 when an overvoltage situation occurs. This type of deposition also facilitates manufacture, and permits very precise control of the thickness of the layers, including the electrodes 21. After initial placement of the base copper 44 onto the substrate or core 13, additional layers 46, 48 , 50 of a conductive metal are placed onto the terminal pads, as mentioned above. These additional layers could be defined and placed onto these pads by photolithography and deposition techniques, respectively.

The two metal electrodes, whether one or two layers (or more) thick are separated by a gap 25 of a controlled width W2. The substrate subassembly also contains and supports the two (2) terminal pads 34, 36 on the top 57, bottom 58, and sides 59 of the protection device. These bottom 58 and/or sides 59 of the terminal pads 34, 36 serve to attach the device to the board and provide an electrical path from the board to the electrodes 21. Again, the electrodes 21 and the terminal pads consist of a copper sheet 44 laminated to the case substrate material 13. The other layers are deposited, either electrochemically or physical vapor deposition (PVD), simultaneously to ensure a good, continuous conductive path between the electrodes on the top surface of the substrate, and the terminal pads 34, 36 on the bottom of the substrate 13. This configuration allows for ease of manufacture for surface mount assembly techniques to allow for a wrap around configuration of the terminal pads. The gap width W2 between the electrodes 21 are defined by photolithographic techniques and through an etching process. The nature of the photolithographic process allows for very precise control of the width W2 of the separation of the electrode metallization. The gap 25 separating the electrodes 21 extends on a straight line across the top surface of the substrate 13. Proper sizing and configuration of the gap provides for proper trigger voltages and clamping voltages along with fast response time and reliable operation during an overvoltage condition. The electrode metallization can be selected from a variety of elemental or alloy materials, i.e. Cu, Ag, Ni, Ti, Al, NiCr, TiN, etc., to obtain coatings which exhibit desired physical, electrical, and metallurgical characteristics.

Photolithography, mechanical, or laser processing techniques are employed for defining the physical dimensions and width of the gap 25 and of the terminal pads 34, 36. Subsequent photolithography and deposition operations are employed to deposit additional metallization to the terminal pads, i.e. Cu, Ni, and Sn/Pb, to a specified thickness.

The voltage variable polymeric material 43 provides the protection from fast transient overvoltage pulses. The polymeric material 43 provides for a non-linear electrical response to an overvoltage condition. The polymer 43 is a material comprising finely divided particles dispersed in an organic resin or an insulating medium. The polymeric material 43 consists of conductive particles which are uniformly dispersed throughout an insulating binder. This polymer material 43 exhibits a non-linear resistance characteristic which is dependent on the particle spacing and the electrical properties of the binder. This polymer material is available from many sources and is disclosed by a variety of patents as was mentioned above.

The cover coat 56 subassembly is applied after the metal deposition, pattern definition, and polymer 43 application process, to the top surface of the substrate/polymer subassembly to provide a means for protecting the polymeric material 43 and to provide a flat top surface for pick-and-place surface mount technology automated assembly equipment. The cover coat 56 prevents excessive oxidation of the electrodes 21 and the polymer 43 which can degrade the performance of the protection device 60. The cover coat 56 can be comprised of a variety of materials including plastics, conformal coatings, polymers, and epoxies. The cover coat 56 also serves as a vehicle for marking the protective devices 60 with the marking being placed between separate layers, or on the surface of the cover coat 56 through an ink transfer process or laser marking.

Figure 2:
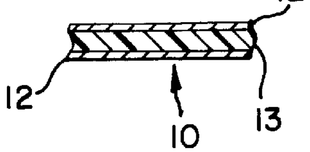
FIG. 2 is a cross-sectional view of a portion of the sheet of FIG. 1, and taken along lines 2—2 of FIG. 1.

This protective device 60 may be made by the following process. Shown in FIGS. 1 and 2 is a solid sheet 10 of an FR-4 epoxy with copper plating 12. The copper plating 12 and the FR-4 epoxy core 13 of this solid sheet 10 may best be seen in FIG. 2. This copper-plated FR-4 epoxy sheet 10 is available from Allied Signal Laminate Systems, Hoosick Falls, N.Y., as Part No. 0200BED130C1/C1GFN0200C1/C1A2C. Although FR-4 epoxy is a preferred material, other suitable materials include any material that is compatible with, i.e., of a chemically, physically and structurally similar nature to, the materials from which PC boards are made, as mentioned above. Thus, another suitable material for this solid sheet 10 is polyimide. FR-4 epoxy and polyimide are among the class of materials having physical properties that are nearly identical with the standard substrate material used in the PC board industry. As a result, the protective device 60 and the PC board to which that protection device 60 is secured have extremely well-matched thermal and mechanical properties. The substrate of the protective device 60 of the present invention also provides desired arc-tracking characteristics, and simultaneously exhibits sufficient mechanical flexibility to remain intact when exposed to the rapid release of energy associated with overvoltage.

In the next step of the process of manufacturing the protective devices 60, the copper plating 12 is etched away from the solid sheet 10 by a conventional etching process. In this conventional etching process, the copper is etched away from the substrate by a ferric chloride solution.

Although it will be understood that after completion of this step, all of the copper layer 12 of FIG. 2 is etched away from FR-4 epoxy core 13 of this solid sheet 10, the remaining epoxy core 13 of this FR-4 epoxy sheet 10 is different from a "clean" sheet of FR-4 epoxy that had not initially been treated with a copper layer. In particular, a chemically etched surface treatment remains on the surface of the epoxy core 13 after the copper layer 12 has been removed by etching. This treated surface of the epoxy core 13 is more receptive to subsequent operations that are necessary in the manufacture of the present surface-mounted subminiature protective device 60.

Figure 3:
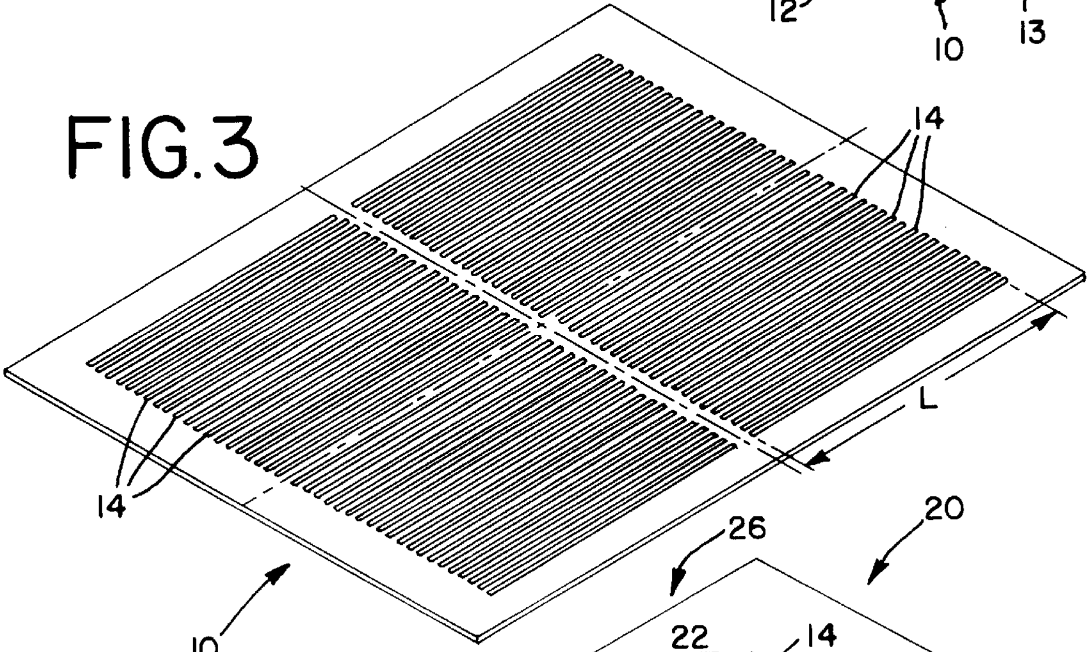
FIG. 3 is a perspective view of the FR-4 epoxy sheet of FIG. 1, but stripped of its copper plating, and with a plurality of slots, each having a width W1 and a length L, routed into separate quadrants of that sheet.

The FR-4 epoxy sheet 10 having this treated, copper-free surface is then routed or punched to create slots 14 along quadrants of the sheet 10, as may be seen in FIG. 3. Dotted lines visually separate these four quadrants in FIG. 3. The width W of the slots 14 (FIG. 4) is about 0.0625 inches. The length L of each of the slots 14 (FIG. 3) is approximately 5.125.

When the routing or punching has been completed, the etched and routed or punched sheet 10 shown in FIG. 3 is again plated with copper. This reapplication of copper occurs through the immersion of the etched and routed sheet of FIG. 3 into an electroless copper plating bath. This method of copper plating is well-known in the art.

This copper plating step results in the placement of a copper layer having a uniform thickness along each of the exposed surfaces of the sheet 10. For example, as may be seen in FIG. 4, the copper plating 18 resulting from this step covers both (1) the flat, upper surfaces 22 of the sheet 10; and (2) the vertical, interstitial regions 16 that define at least a portion of the slots 14. These interstitial regions 16 must be copperplated because they will ultimately form a portion of the terminal pads 34, 36 of the final protection device 60. The uniform thickness of the copper plating will depend upon the ultimate needs of the user.

Figure 4:
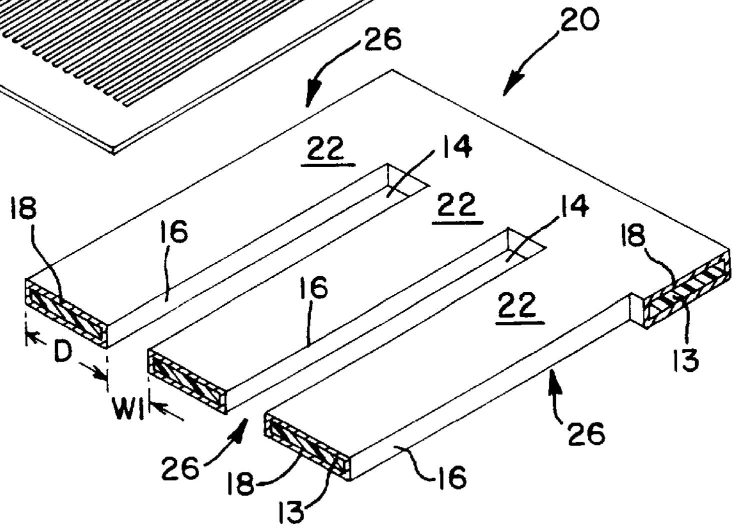
FIG. 4 is an enlarged, cut-away perspective view of a portion of the routed sheet of FIG. 3, but with a copper plating layer having been reapplied.

After plating has been completed, to arrive at the copper-plated structure of FIG. 4, the entire exposed surface of this structure is covered with a so-called photoresist polymer.

An otherwise clear mask is placed over the replated copper sheet 20 after it has been covered with the photoresist. Patterned panels are a part of, and are evenly spaced across, this clear mask. These patterned panels are made of an UV light-opaque substance, and are of a size and shape corresponding to the size and shape generally of the patterns 30 shown in FIG. 5. Essentially, by placing this mask having these panels onto the replated copper sheet 20, several portions of the flat, upward-facing surfaces 22 of the replated copper sheet 20 are effectively shielded from the effects of UV light.

It will be understood from the following discussion that the pattern 30 will essentially define the shapes and sizes of the electrodes 21 and polymer strip 43. A later step defines the remainder of terminal pads 34, 36. It will be appreciated that the width, length and shape of the electrodes 21 and polymer strip 43 may be altered by changing the size and shape of the UV light-opaque panel patterns. In particular, one embodiment of the present invention includes having curved corners 19 (not shown) instead of sharp corners 19 as shown. In fact, it has been seen that it is preferrable to curve the corners 19.

This step, therefore, defines the gap 25 between the electrodes 21, as well as the notches 23 in the electrodes 21. As mentioned above, photolithographic, mechanical, and laser processing techniques can be employed to configure very small, intricate, and complex electrode 21 and gap 25 geometries. The electrode 21 configuration can be conveniently modified to obtain specific electrical characteristics in resultant protective devices 60. The gap width W2 can be changed to provide control of triggering and clamping voltages during an overload event.

The indicated device construction results in a triggering and clamping voltage rating similar to devices of previous construction. Tests have been conducted with peak voltages of 2 kV, 4 kV, and 8 kV as the ESD waveform. The use of a 2 mil and 4 mil gap width resulted in triggering voltages of 100–150 V and clamping voltages of 30–50 V.

Additionally within this step, the backside of the sheet is covered with a photoresist material and an otherwise clear mask is placed over the replated copper sheet 20 after it has been covered with the photoresist. A rectangular panel is a part of this clear mask. The rectangular panels are made of a UV light-opaque substance, and are of a size corresponding to the size of the panel 28 shown in FIG. 6. Essentially, by placing this mask having these panels onto the replated copper sheet 20, several strips of the flat, downward-facing surfaces 28 of the replated copper sheet 20 are effectively shielded from the effects of the UV light.

Figure 6:
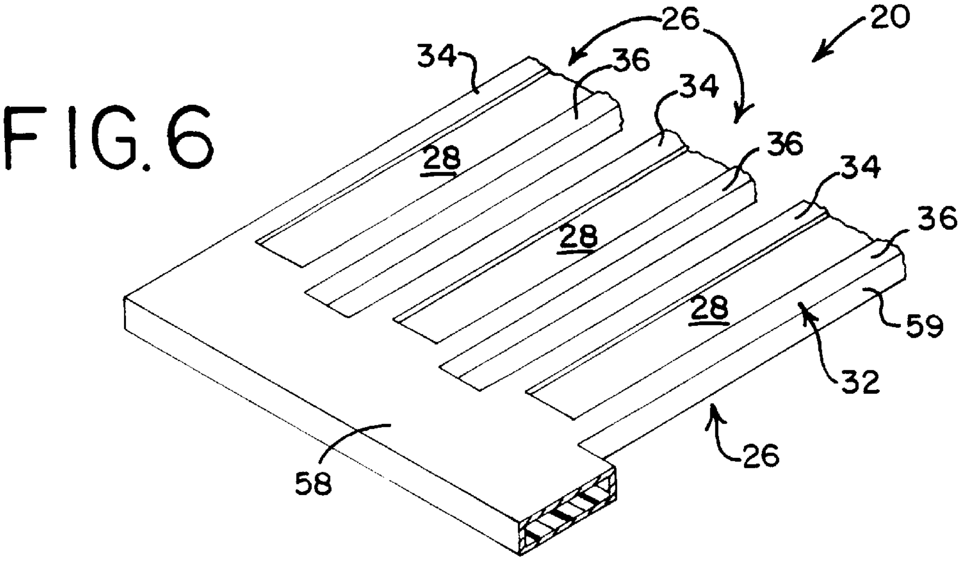
FIG. 6 is a perspective view of the reverse side of FIG. 5, but after the removal of a strip-like portion of copper plating from the replated sheet of FIG. 5.

The rectangular panels will essentially define the shapes and sizes of the wide terminal pads 34 and 36 and the lower middle portion 28 of the bottom 58 of the strip 26. Thus, the copper plating from a portion of the bottom 58 of a strip 26 is defined by a photoresist mask. Particularly, the copper plating from the lower, middle portion 28 of the bottom 58 of the strip 26 is removed. A perspective view of this section of this replated sheet 20 is shown in FIG. 6.

The entire replated, photoresist-covered sheet 20, i.e., the top 57, bottom 58, and sides 59 of that sheet 20, is then subjected to UV light. The replated sheet 20 is subjected to the UV light for a time sufficient to ensure curing of all of the photoresist that is not covered by the square panels and rectangular strips of the masks. Thereafter, the masks containing these square panels and rectangular strips are removed from the replated sheet 20. The photoresist that was formerly below these square panels remains uncured. This uncured photoresist may be washed from the replated sheet 20 using a solvent.

The cured photoresist on the remainder of the replated sheet 20 provides protection against the next step in the process. Particularly, the cured photoresist prevents the removal of copper beneath those areas of cured photoresist. The regions formerly below the patterned panels have no cured photoresist and no such protection. Thus, the copper from those regions can be removed by etching. This etching is performed with a ferric chloride solution.

Figure 5:
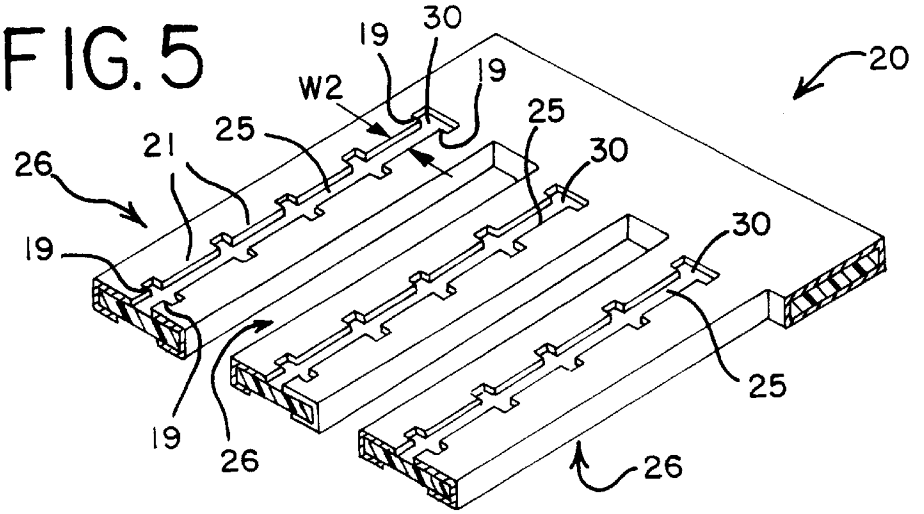
FIG. 5 is a top perspective view of several portions of the flat, upward-facing surfaces of the replated copper sheet from FIG. 4, after each of those portions were masked with a patterned panel of an ultraviolet (UV) light-opaque substance.

After the copper has been removed, as may be seen in FIGS. 5 and 6, the regions formerly below the patterned panels and the rectangular strips of the mask are not covered at all. Rather, those regions now comprise areas 28 and 30 of clear epoxy.

The replated sheet 20 is then placed in a chemical bath to remove all of the remaining cured photoresist from the previously cured areas of that sheet 20.

For the purposes of this specification, the portion of the sheet 20 between adjacent slots 14 is known as a strip 26. This strip has a dimension D as shown in FIG. 4 which defines the length of the device. After completion of several of the operations described in this specification, this strip 26 will ultimately be cut into a plurality of pieces, and each of these pieces becomes an ESD/SMD or protective device 60 in accordance with the invention.

As may also be seen from FIG. 6, the underside 58 of the strip 26 has regions along its periphery which still include copper plating. These peripheral regions 34 and 36 of the underside 58 of the strip 26 form portions of the pads. These pads will ultimately serve as the means for securing the entire, finished protective device 58 to the PC board.

Figure 7:
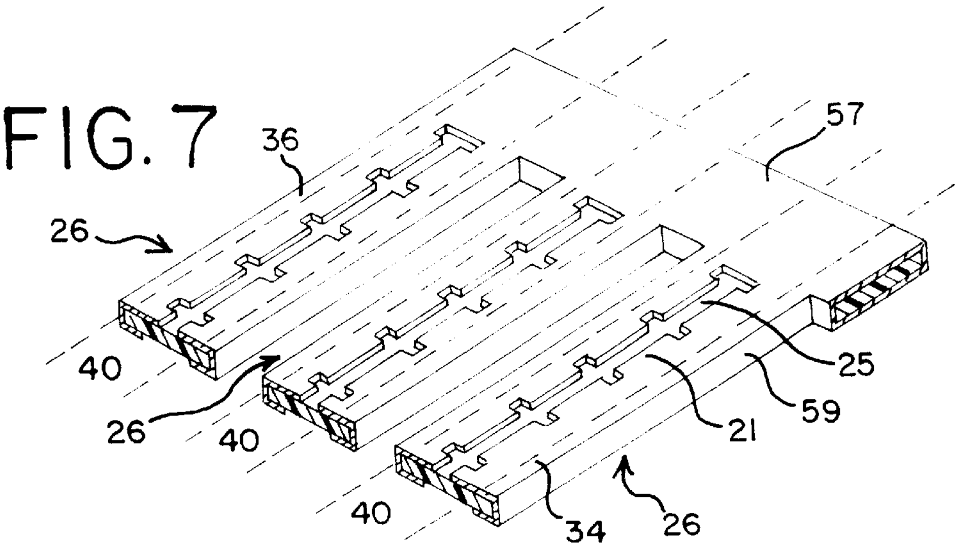
FIG. 7 is a perspective view of the top 57 of the strips 26 of FIG. 6, and showing linear regions 40 defined by dotted lines.

FIG. 7 is a perspective view of the top-side 57 of the strips 26 of FIG. 6. Generally opposite and coinciding with the lower, middle portions 28 of these strips 26 are linear regions 40 on this top-side 38. These linear regions 40 are defined by the dotted lines of FIG. 7.

FIG. 7 is to be referred to in connection with the next step in the manufacture of the invention. In this next step, a photoresist polymer is placed along each of the linear regions 40 of the top side 57 of the strips 26. Through the covering of these linear regions 40, photoresist polymer is also placed along the gap 25 and electrodes 21. These electrodes 21 are made of a conductive metal, here copper. The photoresist is then treated with UV light, resulting in a curing of the photoresist onto linear region 40.

As a result of the curing of this photoresist onto the linear region 40, metal will not adhere to this linear region 40 when the strip 26 is dipped into an electrolytic bath containing a metal for plating purposes.

In addition, as explained above, the middle portion 28 of the underside 58 of the strip 26 will also not be subject to plating when the strip 26 is dipped into the electrolytic plating bath. Copper metal previously covering this metal portion had been removed, revealing the bare epoxy that forms the base of the sheet 20. Metal will not adhere to or plate onto this bare epoxy using an electrolytic plating process.

Figure 8:
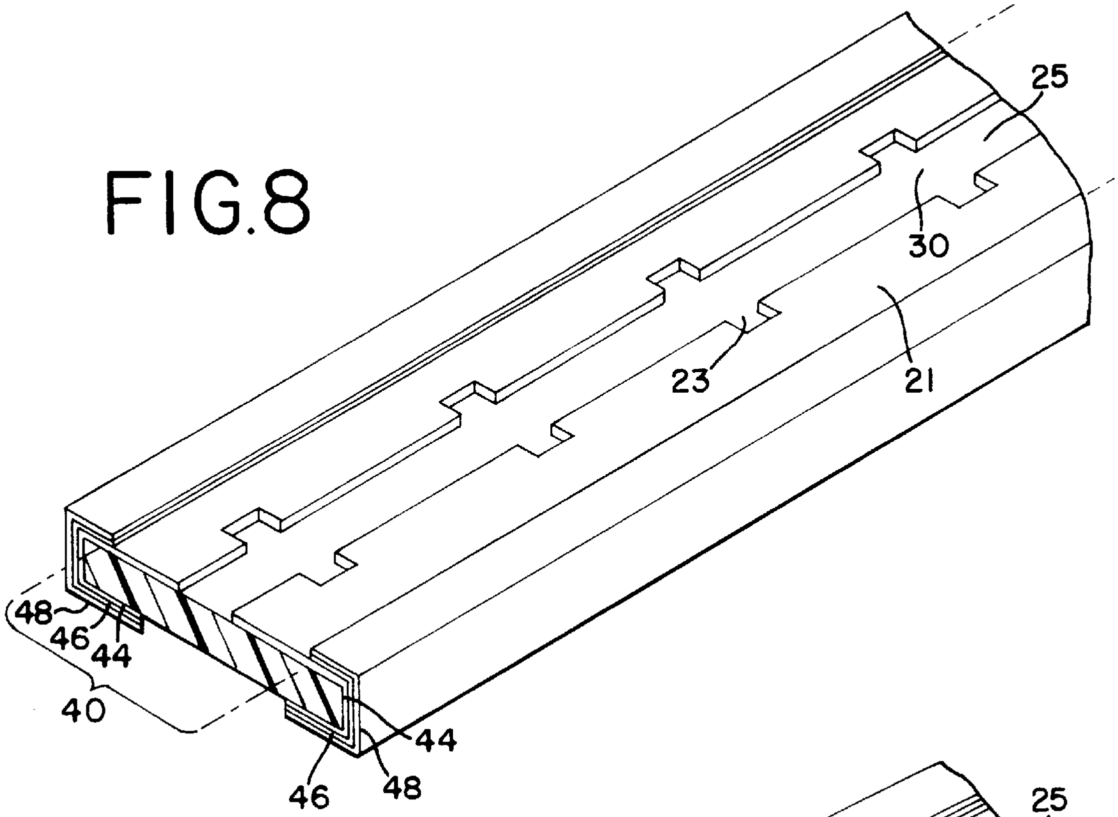
FIG. 8 is a view of a single strip 26 after dipping into a copper plating bath and then a nickel plating bath, with the result that addditional copper layer and a nickel layer are deposited onto the terminal-pads portions of the base copper layer.
Figure 9:
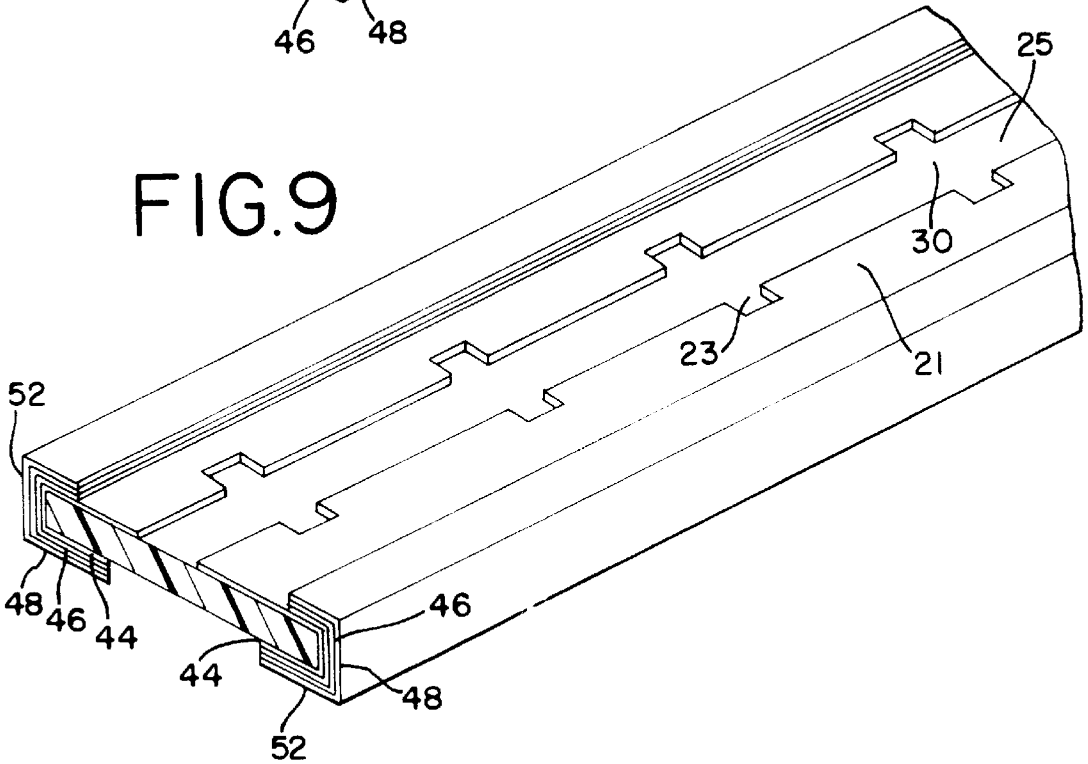
FIG. 9 is a perspective view of the strip of FIG. 8, but after immersion into a tin-lead bath to create another layer over the copper and nickel layers of the terminal pads.

The entire strip 26 is dipped into an electrolytic copper plating bath and then an electrolytic nickel plating bath. As a result, as may be seen in FIG. 8, copper 46 and nickel layers 48 are deposited on the base copper layer 44. After deposition of these copper 46 and nickel layers 48, an additional tin-lead layer 52 is deposited in these same areas through an electrolytic tin-lead bath as shown in FIG. 9. The cured photoresist polymer on the linear region 40 is then removed.

Figures 10, 11:
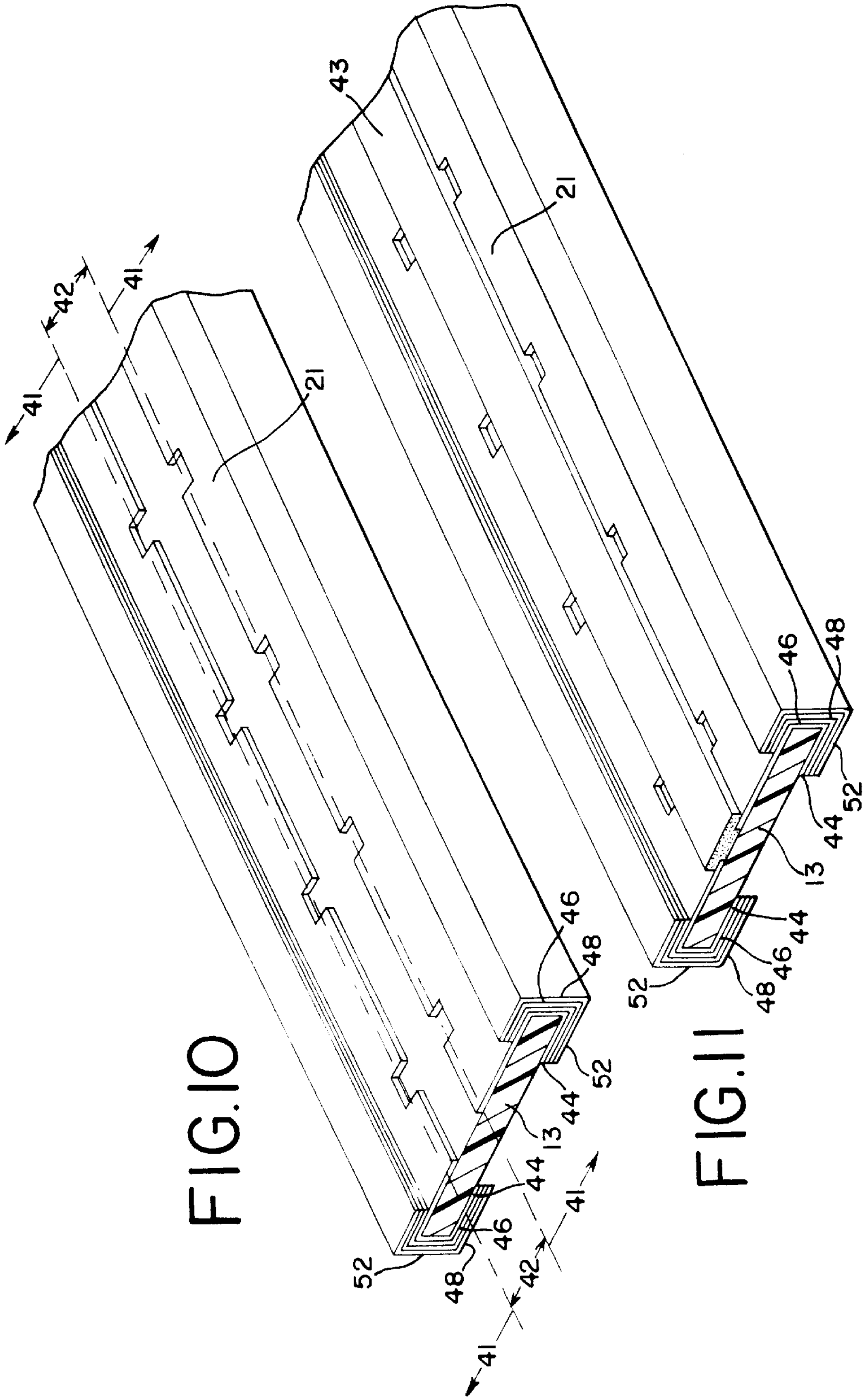
FIG. 10 shows the strip of FIG. 9, depicting the region where the voltage variable polymeric strip will be applied.
FIG. 11 shows the strip of FIG. 10, but with an added polymeric material 43 into the gap 25 of the strip 26.

As shown in FIGS. 10 and 11, the polymer material 43 is then applied. The polymer 43 can be be applied in a number of ways. For example, the polymer 43 can be applied using the stencil printing machine shown in FIG. 14 in a manner similar to the use of the stencil printing described further below. In addition, the polymer 43 can be applied manually with a tube of the polymer 43. Other automated means for applying the polymer 43 are possible as well. Once the polymer 43 has been applied and deposited within region 42, and in between regions 41, the sheet 20 is heat cured to solidify the polymer 43 to obtain strips 26 that look like the strip 26 in FIG. 11.

Figure 12:
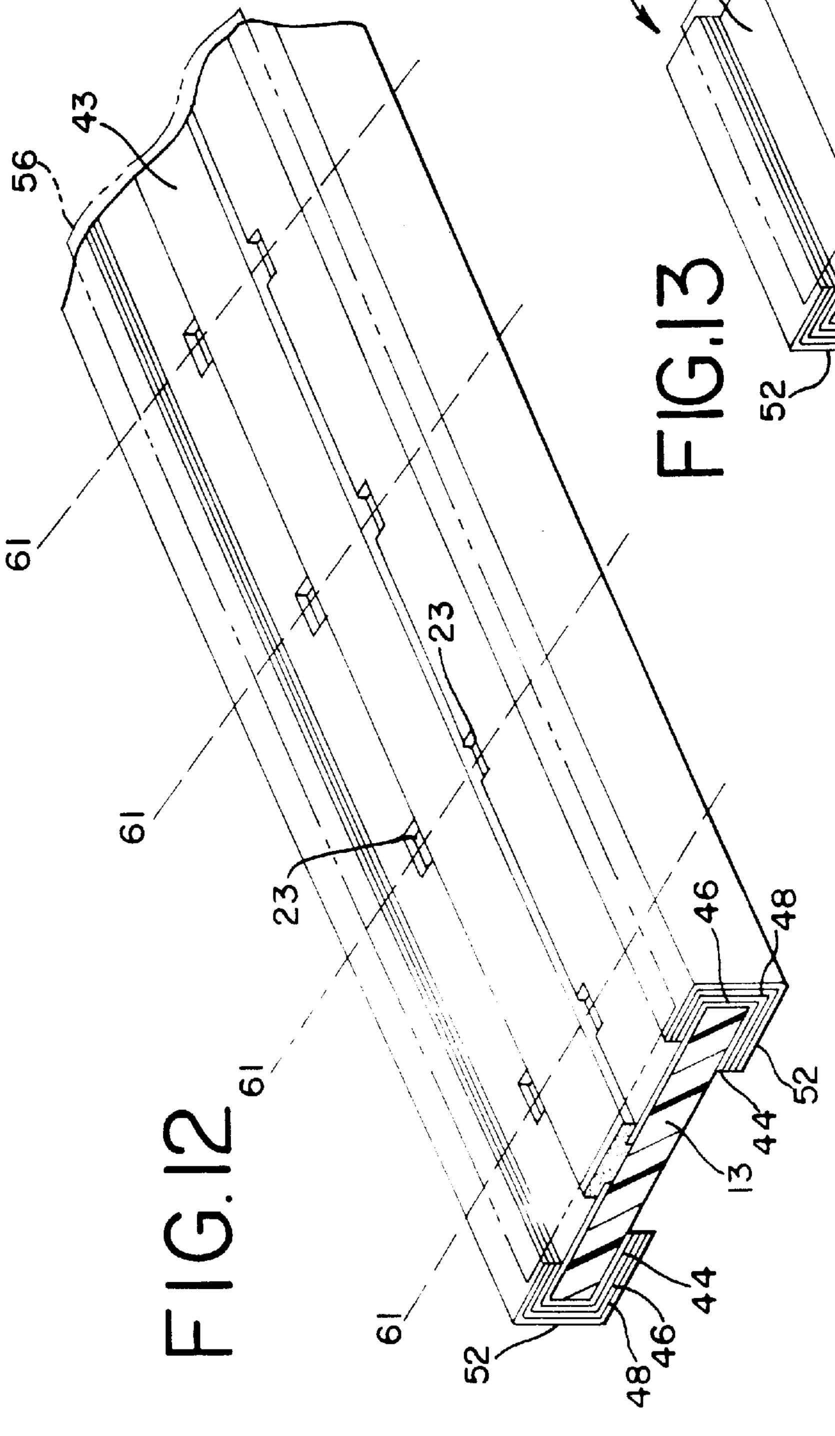
FIG. 12 shows the strip of FIG. 11, but with an added cover coat 56 over the electrodes 21 and polymeric material 43.

The next step in the manufacture of the protective device 60 is the placement, across the length of the most of the top 57 of the strip 26, of a protective layer 56 (FIG. 12). This protective layer 56 is the third subassembly of the present protective device 60, and forms a relatively tight seal over the electrodes 21 and polymer strip 43 area. In this way, the protective layer 56 provides protection from oxidation and impacts during attachment to the PC board. This protective layer also serves as a means of providing for a surface for pick and place operations which use a vacuum pick-up tool.

This protective layer 56 helps to control the melting, ionization and arcing which occur in the fusible link 42 during current overload conditions. The protective layer 56 or cover coat material provides desired arc-quenching characteristics, especially important upon interruption of the fusible link 42.

The application of the cover coat 56 is such that it can be performed in a single processing step using a simple fixture to define the shape of the body of the device. This method of manufacture provides for advantages over current methodologies in protecting the electrodes 21, gap 25, and polymer 43 from physical and environmental damage. The application of the conformal coating 56 is performed in such a fashion that the physical location of the electrode gap 25 is not critical, as in a clamping or die mold method. The conformal coating may be mixed with a colored dye prior to application to provide for a color-coded voltage rated protective device 60.

The protective layer 56 may be comprised of a polymer, preferably a polyuretane gel or paste when a stencil printing cover coat application process is used, and preferrably a polycarbonate adhesive when an injection mold cover coat application process is used. A preferred polyurethane is made by Dymax. Other similar gels, pastes, and adhesives are suitable for the invention depending on the cover coat application process used. In addition to polymers, the protective layer 56 may also be comprised of plastics, conformal coatings and epoxies.

Figure 14:
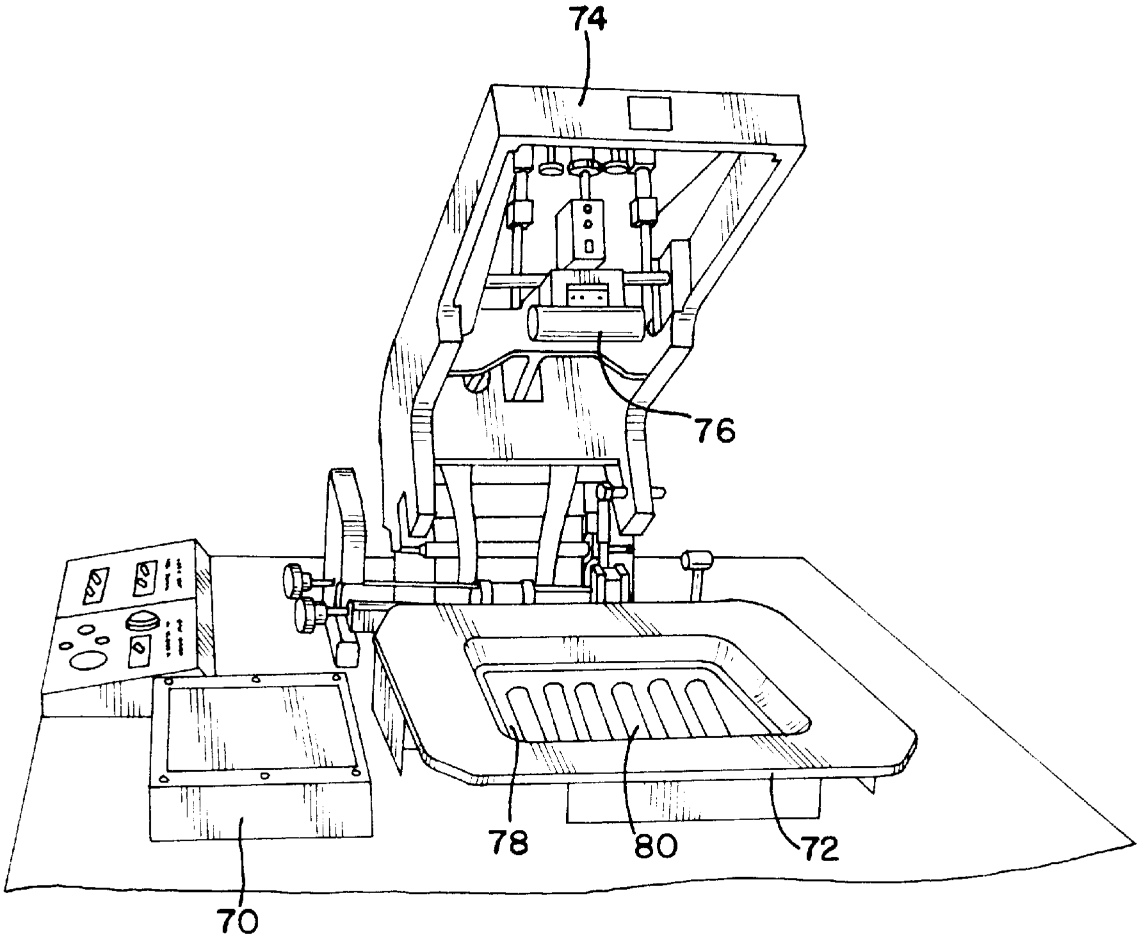
FIG. 14 is a front view of the stencil printing machine used to perform the stencil printing step of the ESD/SMD manufacturing process.

This protective layer 56 is applied to the strips 26 using a stencil printing process which includes the use of a common stencil printing machine shown in FIG. 14. It has been found that stencil printing is faster than some alternative processes for applying the cover coat 56, such as with an injection mold process using die molds. Specifically, it has been found that the use of a stencil printing process while using a stencil printing machine, at least, doubles production output from the injection mold operation. The stencil printing machine is made by Affiliated Manufacturers, Inc. of Northbranch, N.J., Model No. CP-885.

In the stencil printing process, the material is applied to all of the strips 26 in one quadrant of the sheet 20, simultaneously. Using the stencil print process, the material cured much faster than the injection mold process because the cover coat material is directly exposed to the UV radiation, while the UV light must travel through a filter in the injection mold process. Furthermore, the stencil printing process produces a more uniform cover coat than the injection filling process, in terms of the height and the width of the cover coat 56. Because of that uniformity, the fuses can be tested and packaged in a relatively fast automated processs. With the injection filling process it may be difficult to precisely align the protective devices 60 in testing and packaging equipment due to some non-uniform heights and widths of the cover coat 56.

The stencil printing machine comprises a slidable plate 70, a base 72. a squeegee arm 74, a squeegee 76, and an overlay 78. The overlay 78 is mounted on the base 72 and the squeegee 76 is movably mounted on the squeegee arm 74 above the base 72 and overlay 78. The plate 70 is slidable underneath the base 72 and overlay 78. The overlay 78 has parallel openings 80 which correspond to the width of the cover coat 56.

The stencil printing process begins by attaching an adhesive tape under the sheet 20. The sheet 20, with the adhesive tape attached, is placed on the plate 70 with the adhesive tape between the plate 70 and the fuse sheet 20. The cover coat 56 material is then applied with a syringe at one end of the overlay 78. The plate 70 slides underneath the overlay 78 and lodges the sheet 20 underneath the overlay 78 in correct alignment with the parallel openings 80. The squeegee 76 then lowers to contact the overlay 78 beyond the material on the top of the overlay 78. The squeegee 76 then moves across the overlay 78 where the openings 80 exist, thereby forcing the cover coat 56 material through the openings 80 and onto each of the strips 26 of the sheet 20. Thus, the cover coat now covers the electrodes 21, the gap, 25, and the polymer strip 43 (FIGS. 12 and 13). The squeegee 76 is then raised, and the sheet 20 is unlodged from the overlay 78. The openings 80 in the overlay 78 are wide enough so that the protective layer partially overlaps the pads 34, 36, as shown in FIGS. 12 & 13. In addition, the material used as the cover coat material should have a viscosity in the paste or gel region so that after the material is spread onto the sheet 20, it will flow in a manner which creates a generally flat top surface 49, but such that the material 56 will not flow into the slots 14. The sheet 20 of strips 26 are then UV cured in a UV chamber. At the end of this curing, the polyurethane gel or paste has solidified, forming the protective layer 56 (FIGS. 12 and 13).

Although a colorless, clear cover coat is aesthetically pleasing, alternative types of cover coats may be used. For example, colored, clear or transparent cover coat materials may be used. These colored materials may be simply manufactured by the addition of a dye to a clear cover coat material. Color coding may be accomplished through the use of these colored materials. In other words, different colors of the cover coat can correspond to different ratings, providing the user with a ready means of determining the rating of any given protective device 60. The transparency of both of these coatings permit the user to visually inspect the polyer strip 43 prior to installation, and during use.

The strips 26 are then ready for a so-called dicing operation, which separates those strips 26 into individual fuses. In this dicing operation, a diamond saw or the like is used to cut the strips 26 along parallel planes 61 (FIG. 12) into individual thin film surface-mounted fuses 60 (FIG. 13). The cuts bisect the notches 23 in the electrodes 21. At this point, it can more easily be understood that the metalization of the electrodes 21 is removed from the notches 23 or notched areas 23. Specifically, it is easier to cut through notched areas 23 without the electrodes. In addition, during dicing, curling of the metalization may take place along the cut, thereby causing a curl of metal (part of an electrode) to move into the gap area and effectively reduce the gap width W2. Putting the notches 23 in the places where the dicing is to take place alleviates this possible problem and other possible problems. It should be noted that the notches 23 can extend further toward the pads 34, 36, and that the corners 19 of the notches 23 can be curved in alternative embodiments.

This cutting operation completes the manufacture of the thin film protective device 60 (FIG. 13) of the present invention.

All of the preceding features combine to produce an ESD/SMD device assembly which exhibits improved control of triggering and clamping voltage characteristics by regulating electrode and gap geometries, and the polymer 43 composition. The dimensional control aspects of the deposition and photolithographic processes, coupled with the proper selection of electrode and polymer 43 material, provide for consistent triggering and clamping voltages.

However, it will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A surface-mounted circuit protection device comprising:

a substrate having an upper surface;

a pair of electrodes deposited on the upper surface of the substrate separated by a gap having a gap width, wherein the gap width, at least, partially determines a voltage rating for the circuit protection device, the electrodes having one or more notches therein for preventing narrowing of the gap width; and, a voltage variable polymeric material deposited between the electrodes in the gap of the upper surface of the substrate for protection against electrostatic transient voltage damage to electrical components.

2. The surface-mount circuit protection device of claim 1, wherein the substrate has a periphery and the notches lie adjacent the periphery of the substrate.

3. The surface-mount circuit protection device of claim 1, wherein a pair of terminal pads are connected to the pair of electrodes.

4. The surface-mount circuit protection device of claim 1, wherein a first conductive layer is deposited on the substrate to form a pair of terminal pads and the pair of electrodes.

5. The surface-mount circuit protection device of claim 4, wherein the pair of terminal pads consist of a plurality of conductive layers.

6. The surface-mount circuit protection device of claim 5, wherein a protective layer having a flat top surface overlies the voltage variable polymeric material, the electrodes and the notches in the electrodes.

7. The surface-mount circuit protection device of claim 4, wherein the substrate has a lower surface and opposing side surfaces, the first conductive layer being deposited on the upper surface, extending over the side surfaces and terminating on the lower surface of the substrate.

* * * * *